(12) United States Patent
Miyazawa

(10) Patent No.: US 10,903,795 B2
(45) Date of Patent: Jan. 26, 2021

(54) SEMICONDUCTOR AMPLIFIER

(71) Applicant: Sumitomo Electric Device Innovations, Inc., Yokohama (JP)

(72) Inventor: Naoyuki Miyazawa, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 12 days.

(21) Appl. No.: 16/507,114

(22) Filed: Jul. 10, 2019

(65) Prior Publication Data

US 2020/0021246 A1  Jan. 16, 2020

(30) Foreign Application Priority Data

Jul. 11, 2018  (JP) .................................. 2018-131324

(51) Int. Cl.
*H03F 3/191* (2006.01)
*H03F 1/02* (2006.01)
*H03F 3/19* (2006.01)

(52) U.S. Cl.
CPC ............. *H03F 1/0205* (2013.01); *H03F 3/19* (2013.01)

(58) Field of Classification Search
CPC ................................. H03F 3/191; H03F 3/195
USPC ........................................ 330/302, 307, 310
See application file for complete search history.

(56) References Cited

U.S. PATENT DOCUMENTS

| 6,329,879 B1 * | 12/2001 | Maruyama | H01L 23/66 330/133 |
| 7,359,069 B2 * | 4/2008 | Tanaka | B24B 37/26 356/630 |
| 7,632,110 B2 * | 12/2009 | Kanou | B60R 16/0239 361/704 |

FOREIGN PATENT DOCUMENTS

| JP | H5-243871 | 9/1993 |
| JP | 2016-19068 | 2/2016 |

* cited by examiner

*Primary Examiner* — Henry Choe
(74) *Attorney, Agent, or Firm* — Smith, Gambrell & Russell, LLP.

(57) ABSTRACT

A semiconductor amplifier 1 includes transistors 21a and 21b mounted side by side on a bottom plate 2 in a space in a package 6, a matching circuit 22a mounted between the transistors 21a, 21b on the bottom plate 2, a matching circuit 22b mounted on an opposite side of the transistor 21b from the transistor 21a on the bottom plate 2, an input terminal $T_{IN}$ installed on one side of a wiring substrate 3, an output terminal $T_{OUT}$ installed on the other side of the wiring substrate 3, and gate bias terminals $T_{1G}$ and $T_{2G}$ and drain bias terminals $T_{1D}$ and $T_{2D}$ installed at positions with the input terminal $T_{IN}$ and the output terminal $T_{OUT}$ of the wiring substrate 3, and the transistor 21a, the matching circuit 22a, the transistor 21b, and the matching circuit 22b are linearly placed between the input terminal $T_{IN}$ and the output terminal $T_{OUT}$.

10 Claims, 7 Drawing Sheets

SEMICONDUCTOR AMPLIFIER

TECHNICAL FIELD

The present invention relates to a semiconductor amplifier.

BACKGROUND

As an apparatus that amplifies a high frequency signal, an apparatus in which a plurality of metallized surfaces are formed on an insulating substrate, one transistor chip is placed on one of the metallized surfaces, and an input matching circuit is placed on another grounded metallized surface on the insulating substrate is known (Japanese Unexamined Patent Publication No. H5-243871). In this apparatus, an input terminal is installed on one side of the insulating substrate, and an output terminal is installed on the other side of the insulating substrate.

Also, as a configuration of a high frequency amplifier in which two transistors are connected in multiple stages, a configuration in which two transistors and a matching circuit are placed on a circuit board in a package is known (Japanese Unexamined Patent Publication No. 2016-19068). In this amplifier, a terminal for inputting an input signal to a gate of a first stage transistor via a matching circuit, a terminal for supplying a bias to the gate of the first stage transistor via a matching circuit, and a terminal for supplying a bias to a gate of a second stage transistor via a matching circuit are installed on a first side of the circuit board in this order, and a terminal for supplying a bias to a drain of the first stage transistor via a matching circuit, a terminal for supplying a bias to a drain of the second stage transistor via a matching circuit, and a terminal for outputting an output signal from the drain of the second stage transistor via a matching circuit are installed on a second side opposite to the first side of the circuit board in this order.

In the high frequency amplifier disclosed in Japanese Unexamined Patent Publication No. 2016-19068, bias interference occurs because terminals for supplying a bias to the two transistors are adjacent to each other. Therefore, there are cases in which the output signal is unable to be generated stably. Therefore, there is a demand for a semiconductor amplifier that generates a stable output signal by preventing bias interference in multiple stages of transistors.

SUMMARY

A semiconductor amplifier according to an aspect of the present invention includes a package including a metal bottom plate, an insulating circuit board placed on the bottom plate and including a first opening, an insulating side wall part placed on a peripheral part on the circuit board and including a second opening larger than the first opening and surrounding the first opening, and a lid part placed on the side wall part and sealing a space formed by the first opening and the second opening, first and second transistors mounted side by side on the bottom plate in the space, a first matching circuit mounted between the first transistor and the second transistor on the bottom plate in the space, the first matching circuit connected between a drain of the first transistor and a gate of the second transistor, a second matching circuit mounted adjacent to the second transistor in the space on the bottom plate, the second matching circuit located on an opposite side of second transistor from the first transistor, the second matching circuit connected to a drain of the second transistor, an input terminal installed at a center of one side of the circuit board and connected to a gate of the first transistor, an output terminal installed at a center of the other side opposite to the one side of the circuit board and connected to the drain of the second transistor via the second matching circuit, first and second gate bias terminals installed at positions with either the input terminal or the output terminal of the circuit board interposed therebetween, the first and second gate bias terminals connected to the gate of the first transistor and the gate of the second transistor, respectively, and first and second drain bias terminals installed at positions with the other of the input terminal and the output terminal of the circuit board interposed therebetween, the first and second drain bias terminals connected to the drain of the first transistor and the drain of the second transistor, respectively, and the first transistor, the first matching circuit, the second transistor, and the second matching circuit are linearly placed between the input terminal and the output terminal.

DETAILED DESCRIPTION

Figure 1:
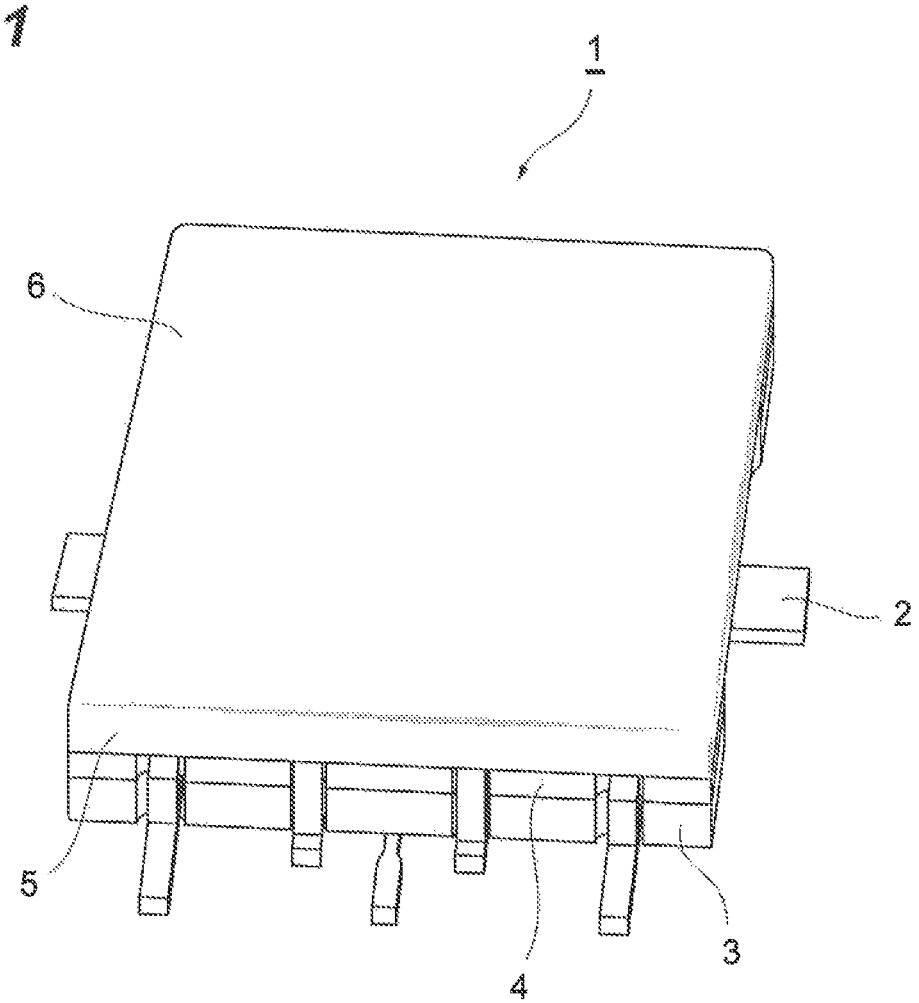
FIG. 1 is a perspective view of a semiconductor amplifier according to an embodiment.

Hereinafter, an embodiment of the present invention will be described with reference to the appended drawings. Note that in the description of the drawings, the same elements are denoted by the same reference numerals, and redundant description will be omitted.

[Configuration of Semiconductor Amplifier]

Figure 2:
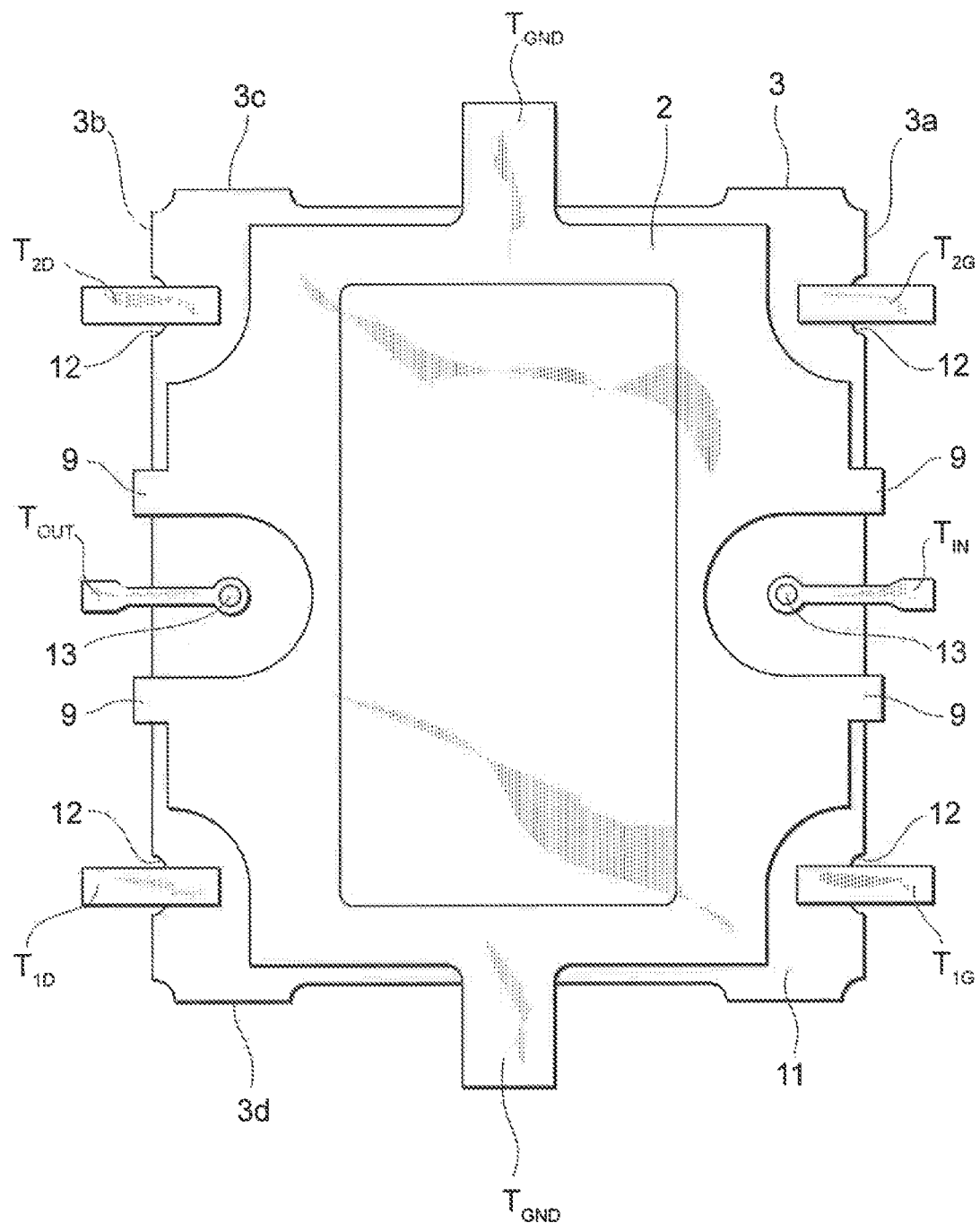
FIG. 2 is a back view of a bottom plate and a circuit board which constitute a package of the semiconductor amplifier of FIG. 1.
Figure 3:
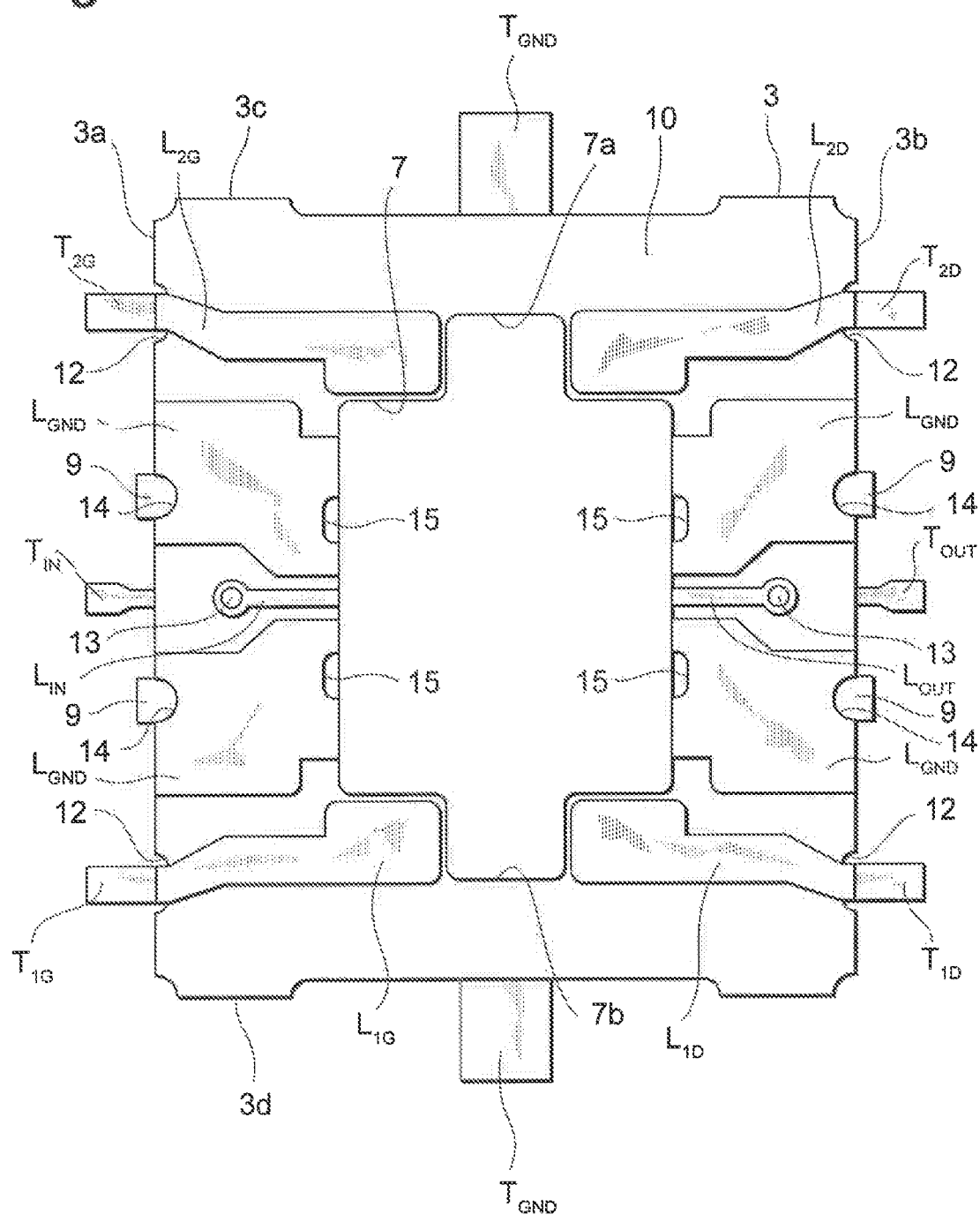
FIG. 3 is a plan view of the bottom plate and the circuit board which constitute the package of the semiconductor amplifier of FIG. 1.
Figure 4:
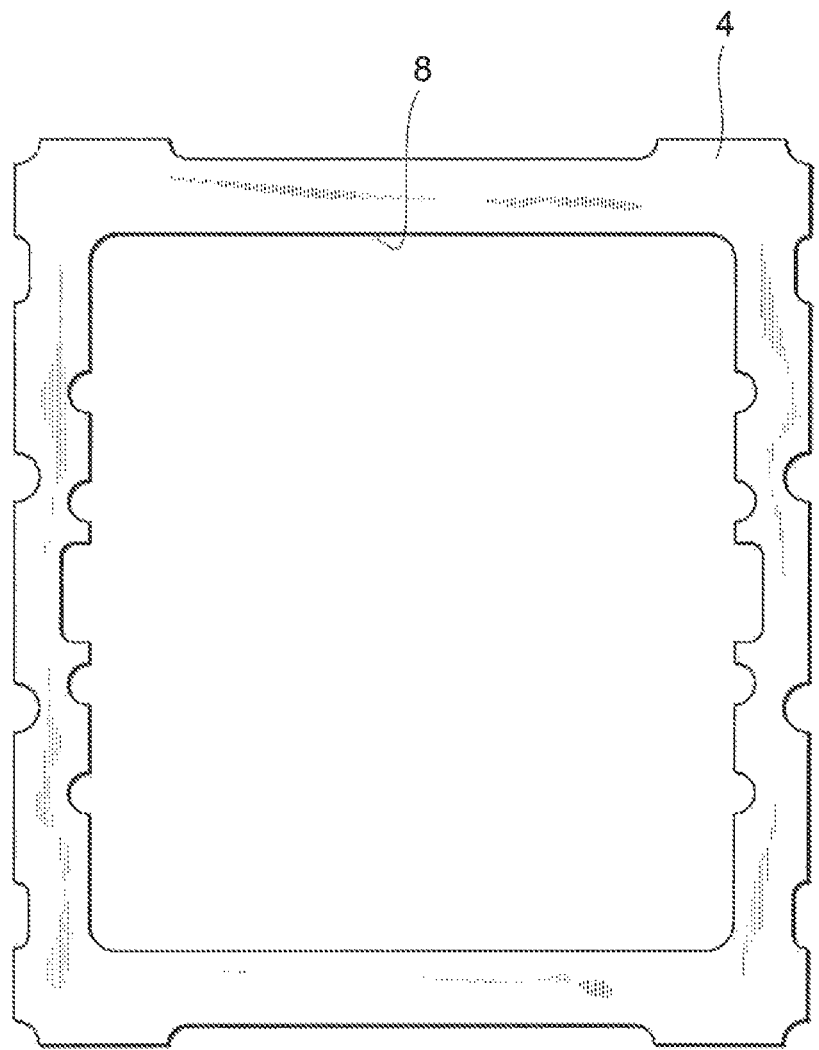
FIG. 4 is a plan view of a side wall part which constitutes the package of semiconductor amplifier of FIG. 1.
Figure 5:
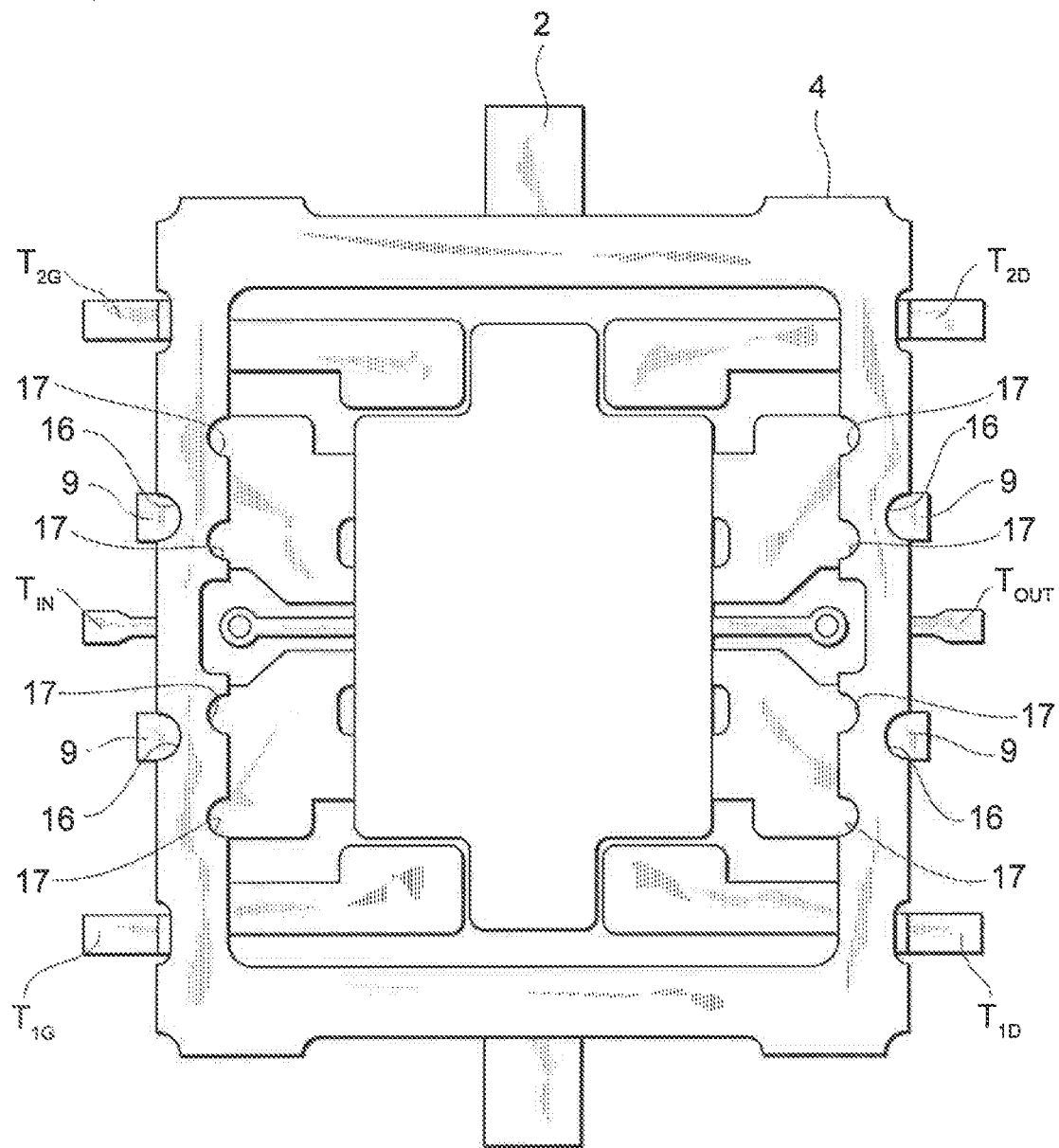
FIG. 5 is a plan view illustrating a state in which a lid part is removed from the semiconductor amplifier of FIG. 1.

FIG. 1 is a perspective view of a semiconductor amplifier according to an embodiment, FIG. 2 is a back view of a bottom plate and a circuit board which constitute a package of the semiconductor amplifier, FIG. 3 is a plan view of the bottom plate and the circuit board which constitute the package, FIG. 4 is a plan view of a side wall part which constitute the package, and FIG. 5 is a plan view illustrating a state in which a lid part is removed from the semiconductor amplifier. A semiconductor amplifier 1 according to an embodiment is an amplifier for a frequency band of an X band such as 8.5 to 10.1 GHz and is incorporated into an apparatus such as a radar.

As illustrated in FIG. 1, the semiconductor amplifier 1 is constituted such that circuit elements are accommodated in a package 6 having a four-layer structure of a bottom plate 2 made of metal (for example, copper), a wiring substrate 3, a side wall part 4, and a lid part 5. As illustrated in FIGS. 2 and 3, the wiring substrate 3 is a rectangular flat plate member made of an insulating material such as alumina, and a central part thereof includes a substantially rectangular opening 7. The wiring substrate 3 is bonded with the bottom plate 2 in a state in which the opening 7 is covered with the bottom plate 2. The side wall part 4 which is made of a rectangular ring-shaped insulating material (such as alumina) and includes an opening 8 larger than the opening 7 illustrated in FIG. 4 is bonded with a peripheral part of a surface 10 on the opposite side of the wiring substrate 3 from the bottom plate 2 of to surround the entire opening 7 in the opening 8 (FIG. 5). A seal ring made of metal is installed on the opposite side of this side wall part 4 from the wiring substrate 3. The lid part 5 is a rectangular flat plate member made of an insulating material (such as alumina) and is fixed to the seal ring while covering the opening 8, With such a structure, that is, a structure in which the wiring substrate 3, the side wall part 4, and the lid part 5 are placed on the bottom plate 2 in this order, a space on the bottom plate 2 formed by the opening 7 and the opening 8 is sealed.

A size of the package 6 is not limited to a specific size, and for example, a horizontal size thereof is 8.7 mm×8.3 mm, a thickness of the bottom plate 2 is about 0.5 mm, and a thickness in which the wiring substrate 3 and the side wall part 4 are combined is about 0.8 mm.

Further, on a bottom surface of the package 6, that is, on a back surface 11 of the wiring substrate 3, a conductive input terminal $T_{IN}$ extending vertically to a first side 3a is installed at the center of the side 3a. Further, two gate bias terminals $T_{1G}$ and $T_{2G}$ are installed in both end parts of the first side 3a of the back surface 11 with the input terminal $T_{IN}$ interposed therebetween. Also, on the back surface 11, a conductive output terminal $T_{OUT}$ extending vertically to a second side 3b is installed at the center of the side 3b opposite to the first side 3a, Further, two drain bias terminals $T_{1D}$ and $T_{2D}$ are installed in both end parts of the second side 3b of the back surface 11 with the output terminal $T_{OUT}$ interposed therebetween. The input terminal $T_{IN}$ is a terminal for receiving an input signal from the outside, the output terminal $T_{OUT}$ is a terminal for outputting an amplified signal to the outside, the two gate bias terminals $T_{1G}$ and $T_{2G}$ are terminals for supplying a gate bias to two transistors in the package 6, and the two drain bias terminals $T_{1D}$ and $T_{2D}$ are terminals for supplying a drain bias to these transistors.

Further, in the bottom plate 2, a ground terminal $T_{GND}$ extending vertically to the sides 3c and 3d is formed in the central part of each of a third side 3c and a fourth side 3d connecting the two sides 3a and 3b of the wiring substrate 3. Further, in the bottom plate 2, two protruding parts 9 vertically protruding from the side 3a are formed between the input terminal $T_{IN}$ on the first side 3a and each of the two gate bias terminals $T_{1G}$ and $T_{2G}$. Further, in the bottom plate 2, two protruding parts 9 vertically protruding from the side 3b are also formed between the output terminal $T_{OUT}$ on the second side 3b and each of the two drain bias terminals $T_{1D}$ and $T_{2D}$. The ground terminal $T_{GND}$ is a terminal for connecting the bottom plate 2 to the ground, and the protruding part 9 is a connection member for electrically connecting the bottom plate 2 with a wiring part on the wiring substrate 3.

Here, the configuration of the wiring substrate 3 will be described in more detail.

The opening 7 formed in the wiring substrate 3 includes a convex notched part 7a protruding toward the central part of the third side 3c and a convex notched part 7b protruding toward the central part of the fourth side 3d. Further, in the surface 10 on the opposite side of the wiring substrate 3 from the bottom plate 2, a conductive wiring part $L_{2G}$ is formed between the notched part 7a and the first side 3a, and a conductive wiring part $L_{2D}$ is formed between the notched part 7a and the second side 3b. Similarly, in the surface 10, a conductive wiring part $L_{1G}$ is formed between the notched part 7b and the first side 3a, and a conductive wiring part $L_{1D}$ is formed between notched part 7b and the second side 3b. The wiring parts $L_{2G}$, $L_{2D}$, $L_{1G}$, and $L_{1D}$ are electrically connected with the gate bias terminal $T_{2G}$, the drain bias terminal $T_{2D}$, the gate bias terminal $T_{1G}$, and the drain bias terminal $T_{1D}$, respectively, via metal embedded in a hollow part 12 formed on the side surface of the wiring substrate 3. For example, when a circuit element is soldered to the wiring substrate 3, a solder fillet is formed in the hollow part 12, and each of the wiring part $L_{2G}$, $L_{2D}$, $L_{1G}$, and $L_{1D}$ is connected to the gate bias terminal $T_{2G}$, the drain bias terminal $T_{2D}$, the gate bias terminal $T_{1G}$, and the drain bias terminal $T_{1D}$.

Further, in the surface 10, a linear conductive wiring part L extending vertically to the side 3a from the vicinity of the opening 7 to the front of the side 3a is formed between the opening 7 and the central part of the first side 3a. Further, in the surface 10, a linear conductive wiring part $L_{OUT}$ extending vertically to the side 3b from the vicinity of the opening 7 to the front of the side 3b is formed between the opening 7 and the central part of the second side 3b. These wiring parts $L_{IN}$ and $L_{OUT}$ are electrically connected to the input terminal $T_{IN}$ and the output terminal $T_{OUT}$ via via holes 13 penetrating the wiring substrate 3, respectively.

Further, in the surface 10, two wiring parts $L_{GND}$ are formed from the opening 7 to the side 3a between the opening 7 and the first side 3a. Also, in the surface 10, two wiring parts $L_{u\,ND}$ are formed from the opening 7 to the side 3b between the opening 7 and the second side 3b. The four wiring parts $L_{GND}$ are formed between the wiring part $L_{2G}$ and the wiring part $L_{IN}$, between the wiring part $L_{1G}$ and the wiring part $L_{IN}$, between the wiring part $L_{2D}$ and the wiring part $L_{OUT}$, and between the wiring part $L_{1D}$ and the wiring part $L_{OUT}$. The wiring parts $L_{GND}$ are electrically connected to the bottom plate 2 via metal embedded in a hollow part 14 formed on the side surface of the wiring substrate 3 and the protruding part 9 and are electrically connected to the bottom plate 2 via metal embedded in a hollow part 15 formed on an inner wall of the opening 7 of the wiring substrate 3. Accordingly, the wiring parts $L_{GND}$ are grounded. For example, when the circuit element is soldered to the wiring substrate 3, solder fillets are formed in the hollow parts 14 and 15, and the wiring parts $L_{GND}$ and the bottom plate 2 are connected.

As described above, the seal ring is placed on the upper surface of the side wall part 4. The seal ring is electrically connected to the bottom plate 2 via metal embedded across a hollow part 16 formed on an outer side surface of the side wall part 4 and the hollow part 14 of the wiring substrate 3 and the protruding part 9 (FIG. 5). At the same time, the seal ring is electrically connected to the bottom plate 2 via metal embedded in a hollow part 17 formed on an inner side surface of the side wall part 4 and the wiring part $L_{GND}$ (FIG. 5). Accordingly, the seal ring of the side wall part 4 is grounded. For example, when the circuit element is soldered to the wiring substrate 3, solder fillets are formed in the hollow parts 16 and 17, and the seal ring and the bottom plate 2 are connected.

Figure 6:
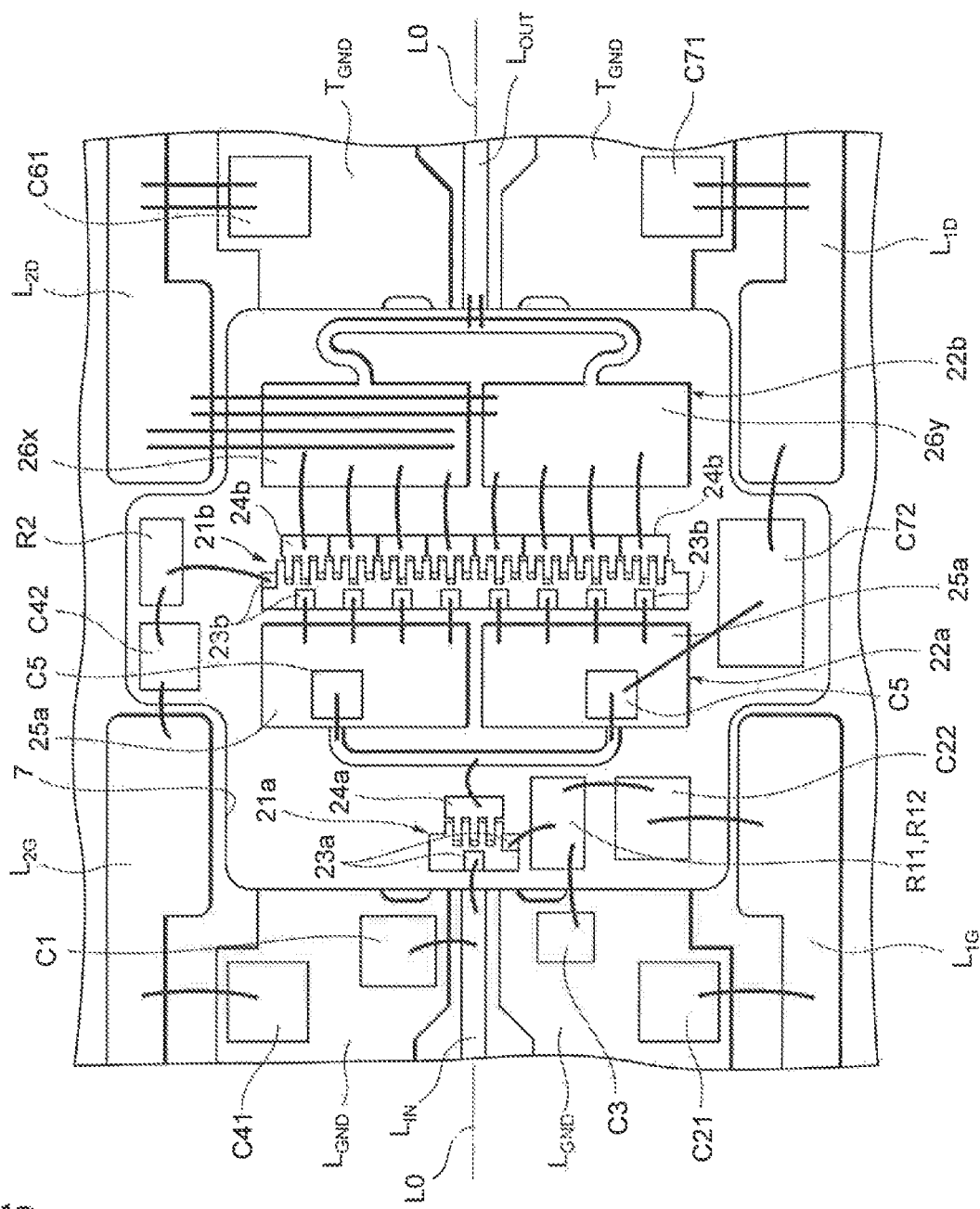
FIG. 6 is a plan view illustrating a mounted state of circuit elements in the semiconductor amplifier of FIG. 1.
Figure 7:
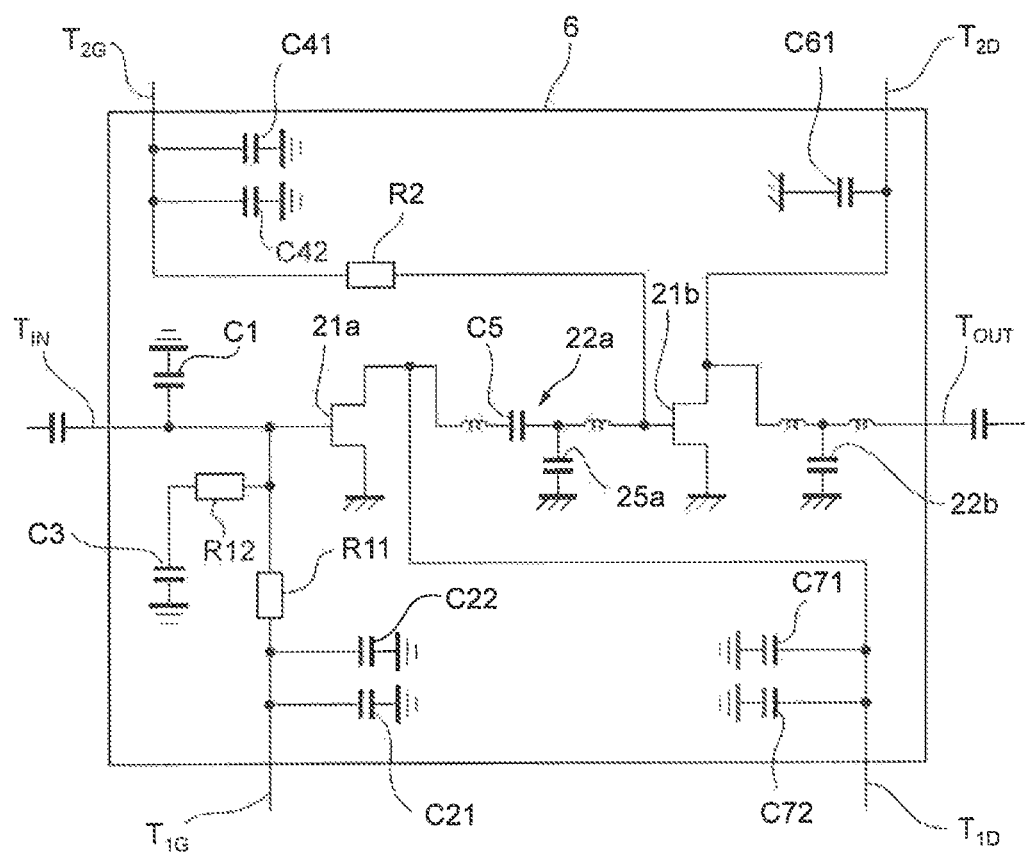
FIG. 7 is a circuit diagram illustrating a circuit configuration of the semiconductor amplifier of FIG. 1.

In the package 6 of the above-described structure, each circuit element is mounted in the space formed by the opening 7 and the opening 8. A mounting form and a circuit configuration of the circuit elements in the semiconductor amplifier 1 will be described below with reference to FIGS. 6 and 7. FIG. 6 is a plan view illustrating the mounted state of the circuit elements in the semiconductor amplifier 1, and FIG. 7 is a circuit diagram illustrating a circuit configuration of the semiconductor amplifier 1. In the package 6 of the semiconductor amplifier 1, three bias resistive elements R11, R12, and R2, nine capacitors C1, C3, C21, C22, C41, C42, C61, C71, and C72, two-stage of transistors 21*a* and 21*b*, and two matching circuits 22*a* and 22*b* are mounted. Among these, the transistor 21*a* in the former stage, the matching circuit 22*a*, the transistor 21*b* in the latter stage, and the matching circuit 22*b* are placed to be linearly lined up in this order between the input terminal $T_{IN}$ and the output terminal $T_{OUT}$ on the bottom plate 2 in the package 6.

The two stages of transistors 21*a* and 21*b* are, for example, field effect transistors such as high electron mobility transistors (HEMTs) mainly composed of a GaN-based material and are arranged side by side on the bottom plate 2 inside the opening 7. The size of the transistor 21*b* is larger than the size of the transistor 21*a*, and a size ratio of the transistor 21*a* and the transistor 21*b* is, for example, 1:5. The transistor 21*a* in the front stage is placed in the vicinity of the wiring part $L_{IN}$ on the wiring substrate 3 at the edge in the opening 7, and a gate 23*a* thereof is electrically connected to the wiring part $L_{IN}$ by a bonding wire. The transistor 21*b* in the latter stage is separately placed, apart from the transistor 21*a* toward the wiring part $L_{OUT}$ side with the matching circuit 22*a* interposed therebetween in the central part in the opening 7.

The capacitors C1, C3, C21, C41, C61, and C71 are die capacitors mounted in a state in which the back surface comes in direct contact with the wiring part $L_{GND}$ on the wiring substrate 3. The capacitors C22, C42, and C72 are die capacitors mounted in a state in which the back surface comes in direct contact with the bottom plate 2 in the opening 7.

The resistive elements R11 and R12 are placed on the bottom plate 2 adjacent to the transistor 21*a* on the side 3*d* side of the wiring substrate 3 and connected in series on a resistor chip. The resistive elements R11 and R12 are connected in series on a resistor chip having a plurality of electrodes on the surface to constitute a series circuit. The terminal of the series circuit on the resistive element R11 side is connected to the wiring part $L_{1G}$ by a bonding wire via the surface of the capacitor C22 placed on the bottom plate 2. A terminal of the series circuit between the two resistive elements R11 and R12 is connected to the gate 23*a* of the transistor 21*a* by a bonding wire. Further, the terminal of the series circuit on the resistive element R12 side is connected to the surface of capacitor C3 on the wiring substrate 3. Further, the wiring part $L_{1G}$ is connected to the surface of the capacitor C21 on the wiring substrate 3 by a bonding wire. The wiring part $L_{IN}$ is connected to the surface of the capacitor C1 on the wiring substrate 3 by a bonding wire. Further, a coupling capacitor is connected to the input terminal $T_{IN}$ outside the package 6.

With such a configuration, the gate 23*a* of the transistor 21*a* can be supplied with the gate bias from the gate bias terminal $T_{1G}$ via the resistive element R11 and also supplied with an input signal from the input terminal $T_{IN}$ via the coupling capacitor. Also, this gate 23*a* is grounded via the resistive element R12 and the capacitor C3. Further, the gate bias terminal $T_{1G}$ is bypassed by the capacitor C21 and the capacitor C22 at high frequencies.

In the transistor 21*b* in the latter stage, the gate 23*b* is connected to the wiring part $L_{2G}$ by a bonding wire via the surface of the capacitor C42 through the resistive element R2. Further, the wiring part $L_{2G}$ is connected to the surface of the capacitor C41 on the wiring substrate 3 by a bonding wire. With such a connection, the gate bias can be supplied to the gate 23*b* from the gate bias terminal $T_{2G}$ via the resistive element R2. Also, the gate bias terminal $T_{2G}$ is bypassed by the capacitors C41 and C42 at high frequencies.

In the transistor 21*a* in the former stage, a source is connected to the bottom plate 2 via a via hole (not illustrated). A drain 24*a* of the transistor 21*a* is connected to the wiring part $L_{1D}$ by a bonding wire via a surface electrode of the matching circuit 22*a* on the bottom plate 2 and the surface of the capacitor C72. Also, the wiring part $L_{1D}$ is connected to the surface of the capacitor C71 on the wiring substrate 3 by a bonding wire. With such a connection, the drain 24*a* can be supplied with a drain bias from the drain bias terminal $T_{1D}$. Also, the drain bias terminal $T_{1D}$ is bypassed by the capacitor C71 and the capacitor C72 at high frequencies.

The matching circuit 22*a* is mounted between the two-stage transistor 21*a* and 21*b* on the bottom plate 2, and the capacitor C5 which is a die capacitor is mounted on the matching circuit 25*a* which is a die capacitor so that the back surface of the capacitor C5 comes into contact with the surface of the matching circuit 25*a*. The matching circuit 22*a* has a pair of circuit elements symmetrical to a virtual line L0 connecting the input terminal $T_{IN}$ and the output terminal $T_{OUT}$ corresponding to the size of the transistor 21*b*, and the matching circuit 25*a* and the capacitor C5 are included in each circuit element. With such a bifurcated configuration, the output of the transistor 21*a* in the former stage is electrically equally output to each finger electrode of the transistor 21*b* in the latter stage widely placed in the direction vertical to the virtual line L0. The surfaces of the two capacitors C5 are directly connected to the drain 24*a* of the transistor 21*a* in the former stage by a bonding wire. The gate 23*b* of the transistor 21*b* in the latter stage is connected to the surfaces of the two matching circuits 25*a* by a plurality of bonding wires.

In such a configuration of the matching circuit 22*a*, a T-type LCL circuit is constituted by an inductance component included in the bonding wire between the drain 24*a* of the transistor 21*a* in the former stage and the capacitor C5, the matching circuit 25*a*, and an inductance component included in the bonding wire between the matching circuit 25*a* and the gate 23*b* of the transistor 21*b* in the latter stage. Accordingly, it is possible to cause an impedance seen from the drain 24*a* to be closer to an output impedance through impedance conversion, and it is possible to perform efficient signal amplification. Also, the capacitors C71 and C72 are directly connected to the drain 24*a* of the transistor 21*a* in the former stage, but the drain 24*a* and a power source connected to the drain bias terminal $T_{1D}$ are isolated at high frequencies by the inductance component of the bonding wire connecting the capacitor C72 and the capacitor C5.

In the transistor 21*b* in the latter stage, the source is connected to the bottom plate 2 via a via hole (not illustrated). Further, a drain 24*b* of the transistor 21*b* is connected to the wiring part $L_{2D}$ by a bonding wire via the surface electrode of the matching circuit 22*b* on bottom plate 2. Also, the wiring part $L_{2D}$ is connected to the surface of the capacitor C61 on the wiring substrate 3 by a bonding wire. Further, the drain 24*b* of the transistor 21*b* is also connected to the wiring part $L_{OUT}$ by a bonding wire via the surface electrode of the matching circuit 22*b*. Further, a coupling capacitor is connected to the output terminal $T_{OUT}$ outside the package 6. With such a connection, the drain 24*b* can be supplied with the drain bias from the drain bias terminal $T_{2D}$. Also, the drain bias terminal $T_{2D}$ is bypassed by the capacitor C61 at high frequencies. Further, the output signal generated by the transistor 21*b* is output from the drain 24*b* to the output terminal $T_{OUT}$ via the matching circuit 22*b*.

The matching circuit 22b is a matching circuit which is a die capacitor mounted adjacent on the output terminal $T_{OUT}$ side to the transistor 21b in the latter stage on the bottom plate 2. The matching circuit 22a includes a pair of circuit elements 26x and 26y symmetrical to the virtual line L0 connecting the input terminal $T_{IN}$ and the output terminal $T_{OUT}$, corresponding to the size of the transistor 21b. A pair of circuit elements 26x and 26y are respectively connected to the drain 24b of the transistor 21b in the latter stage by a plurality of bonding wires (such as four bonding wires) along the virtual line L0, and the lengths of these bonding wires is set to increase as they are distant from the virtual line L0. Further, two circuit elements 26x and 26y are connected to the wiring part $L_{2D}$ by a plurality of bonding wires (such as two bonding wires) having connection points near the virtual line L0 on the surface electrodes of the circuit elements 26x and 26y, and the lengths of the bonding wires are set to have the same length. With such a bifurcated configuration, it is possible to reduce the difference in the distance from each finger electrode of the transistor 21b in the latter stage widely placed in the direction vertical to the virtual line L0 to the output terminal $T_{OUT}$.

In such a configuration of the matching circuit 22b, a T-type LCL circuit is constituted by an inductance component included in the wiring between the drain 24b of the transistor 21b in the latter stage and the matching circuit 22b, the matching circuit 22b, and an inductance component included in the bonding wire between the matching circuit 22b and the wiring part $L_{OUT}$. Accordingly, it is possible to cause an impedance seen from the drain 24b to be closer to an output impedance through impedance conversion, and it is possible to perform efficient signal output. Also, the capacitor C61 is directly connected to the drain 24b of the transistor 21b in the latter stage, but the drain 24b and a power source connected to the drain bias terminal $T_{2D}$ are isolated at high frequencies by the inductance component of the bonding wire connecting the wiring part $L_{2D}$ and matching circuit 22b.

In the semiconductor amplifier 1 of the present embodiment, the transistor 21a, the matching circuit 22a, the transistor 21b, and the matching circuit 22b are mounted in this order to be linearly lined up between the input terminal $T_{IN}$ installed in the central part of the side 3a and the output terminal $T_{OUT}$ installed in the central part of the side 3b on the bottom plate 2 in the space of the package 6. Also, the two gate bias terminals $T_{1G}$ and $T_{2G}$ for supplying the bias to the gates, 23a and 23b of the two stages of transistors 21a and 21b are installed at the end of the package 6 at positions with the input terminal $T_{IN}$ interposed therebetween, and the two drain bias terminals $T_{1D}$ and $T_{2D}$ for supplying the bias to the drains 24a and 24b of the two stages of transistors 21a and 21b are installed at the end of the package 6 at positions with the output terminal $T_{OUT}$ interposed therebetween. In such a configuration, an input signal input from the input terminal $T_{IN}$ is amplified by the two stages of transistors 21a and 21b to generate an output signal, and the output signal is output from the output terminal $T_{OUT}$. In this case, the two stages of transistors 21a and 21b are linearly lined up between the input terminal $T_{IN}$ and the output terminal $T_{OUT}$ together with the two matching circuits 22a and 22b, and the two stages of transistors 21a and 21b are supplied with the bias from the two terminals with the input terminal $T_{IN}$ or the output terminal $T_{OUT}$ interposed therebetween, and thus the bias interference between the two stages of the transistors 21a and 21b is prevented. As a result, it is possible to generate a stable level of output signal while preventing the bias interference in multiple stages of transistors.

Also, in the semiconductor amplifier 1, the input terminal $T_{IN}$ and the output terminal $T_{OUT}$ are respectively connected with the wiring part $L_{IN}$ and the wiring part $L_{OUT}$ on the wiring substrate 3 connected to the gate 23a of the transistor 21a in the former stage and the matching circuit 22b, respectively, via via holes penetrating the wiring substrate 3. In such a configuration, the input terminal $T_{IN}$ and the output terminal $T_{OUT}$ can be connected to the transistor 21a and the matching circuit 22b on the bottom plate 2 in the package 6 by a short distance wiring. As a result, deterioration of the output signal can be prevented.

Also, the gate bias terminal $T_{1G}$, the gate bias terminal $T_{2G}$, the drain bias terminal $T_{1D}$, and the drain bias terminal $T_{2D}$ are connected with the wiring parts $L_{1G}$, $L_{2G}$, $L_{1D}$, and $L_{2D}$ formed on the wiring substrate 3 via metal embedded in the hollow parts of the side surface of the wiring substrate 3. In this case, the two gate bias terminals $T_{1G}$ and $T_{2G}$, the two drain bias terminals $T_{1D}$ and $T_{2D}$, can be connected to the two transistors 21a and 21b by a short distance wiring. As a result, the level of the output signal can be further stabilized.

Further, the wiring part $L_{GND}$, which is connected to the bottom plate 2 at the side surface of the wiring substrate 3 and the inner wall forming the opening 7, is formed on the wiring substrate 3, and the wiring part $L_{GND}$ is connected to the bottom plate 2 between the input terminal $T_{IN}$ or the output terminal $T_{OUT}$ and the each of the gate bias terminal $T_{1G}$, the gate bias terminal $T_{2G}$, the drain bias terminal $T_{1D}$, and the drain bias terminal $T_{2D}$. In this case, the electrical connection between the wiring part $L_{GND}$ on the wiring substrate 3 and the bottom plate 2 can be secured, and the deterioration of the output signal can be further prevented.

Further, in the present embodiment, the bypass capacitors C21, C41, C71, and C61 connected to the gate bias terminal $T_{1G}$, the gate bias terminal $T_{2G}$, the drain bias terminal $T_{1D}$, and the drain bias terminal $T_{2D}$ for supplying the bias are mounted on the wiring substrate 3 in the packages 6, and the bias terminals are connected to the bypass capacitors C21, C41, C71, and C61 via wires. This connection configuration is common to each bias terminal. In other words, the capacitors C21, C41, C71, and C61 are mounted not on the bottom plate 2 directly connected to the ground but on the wiring part $L_{GND}$ of the wiring substrate 3. Since the wiring part $L_{GND}$ is connected to the bottom plate 2 via the side surface of the wiring substrate 3, a slight inductance component exists from the mounting positions of the capacitors C21, C41, C71, and C61 to the bottom plate 2. Therefore, even though the inductance component inevitably occurs, the component is equal at each bias terminal, and thus it is possible to communalize conditions for setting a resonance frequency caused by such an inductance component outside an operating band of the semiconductor amplifier 1. If a condition for avoiding influence of a high frequency signals is found for a certain bias terminal, the condition can be applied to other bias terminals, and an implementation design of a semiconductor chip and a passive element is simplified.

Further, the additional capacitors C22, C42, and C72 are connected to the bias terminals $T_{1G}$, $T_{2G}$, and $T_{1D}$ other than the drain bias terminal $T_{2D}$ in parallel to the bypass capacitors C21, C41, and C71. The capacitors C22, C42, and C72 are mounted directly on the bottom plate 2, so that the influence of the bonding wire is reduced. Further, since the capacitor C22, C42, and C72 are mounted inside the notched part 7a of the opening 7, a mounting likelihood on the bottom plate 2 is expanded. Also, the presence of the notched part 7a enhances the isolation effects between the bias terminal $T_{1G}$ and the bias terminal $T_{1D}$ and between the bias terminal $T_{2G}$ and the bias terminal $T_{2D}$. Since the transistors 21a and 21b are mounted at the center of the package 6, the wiring from each bias terminal extends to the center of the package 6. As a result, since the distance between the wiring parts becomes narrow in the central part of the package 6, a notch is formed between the bias terminals, and the capacitor directly mounted on the bottom plate 2 is placed there, and thus the bias wirings can be electrically separated. As a result, the bias interference between the transistors 21a and 21b can be prevented, and a stable level of output signal can be generated.

Further, in the matching circuit 22b, a pair of circuit elements 26x and 26y are connected to the wiring part $L_{2D}$ via a plurality of bonding wires of the same length. Accordingly, the output characteristic of the transistor 21b having a large chip size and a large gate width can be stabilized, and the bias supplied to the drain 24b of the transistor 21b can be stabilized as well. As a result, the stable output signal can be generated.

Also, the drain 24b of the transistor 21b and a pair of circuit elements 26x and 26y are connected via a plurality of bonding wires, and the lengths of a plurality of bonding wires are set to increase as they are distant from the virtual line L0. With such a configuration, the effective mutual inductance components can be equalized in a plurality of bonding wires connecting the transistor 21b and the output terminal $T_{OUT}$, and a stable output signal can be generated.

Although the principles of the present invention have been illustrated and described above in an exemplary embodiment, it will be appreciated by those skilled in the art that the present invention can be modified in arrangement and detail without departing from such principles. The present invention is not limited to the specific configurations disclosed in, the present embodiment. Therefore, the right to all modifications and changes coming from claims and the scope of the spirit is claimed.

For example, in the semiconductor amplifier 1 of the above embodiment, the gate bias terminals $T_{1G}$ and $T_{2G}$ may be installed at positions with the output terminal $T_{OUT}$ interposed therebetween or the drain bias terminals $T_{1D}$ and $T_{2D}$ may be installed at positions with the input terminal $T_{IN}$ interposed therebetween.

What is claimed is:

1. A semiconductor amplifier, comprising:
a package including a metal bottom plate, an insulating circuit board placed on the bottom plate and including a first opening, an insulating side wall part placed on a peripheral part on the circuit board and including a second opening larger than the first opening and surrounding the first opening, and a lid part placed on the side wall part and sealing a space formed by the first opening and the second opening;
first and second transistors mounted side by side on the bottom plate in the space;
a first matching circuit mounted between the first transistor and the second transistor on the bottom plate in the space, the first matching circuit connected between a drain of the first transistor and a gate of the second transistor;
a second matching circuit mounted adjacent to the second transistor in the space on the bottom plate, the second matching circuit located on an opposite side of second transistor from the first transistor, the second matching circuit connected to a drain of the second transistor;
an input terminal installed at a center of one side of the circuit board and connected to a gate of the first transistor;
an output terminal installed at a center of the other side opposite to the one side of the circuit board and connected to the drain of the second transistor via the second matching circuit;
first and second gate bias terminals installed at positions with either the input terminal or the output terminal of the circuit board interposed therebetween, the first and the second gate bias terminals connected to the gate of the first transistor and the gate of the second transistor, respectively; and
first and second drain bias terminals installed at positions with the other of the input terminal and the output terminal of the circuit board interposed therebetween, the first and the second drain bias terminals connected to the drain of the first transistor and the drain of the second transistor, respectively,
wherein the first transistor, the first matching circuit, the second transistor, and the second matching circuit are linearly placed between the input terminal and the output terminal.

2. The semiconductor amplifier according to claim 1, wherein the input terminal and the output terminal are connected to an input wiring and an output wiring on the circuit board via via holes penetrating the circuit board, the input wiring and the output wiring connected to the gate of the first transistor and the second matching circuit.

3. The semiconductor amplifier according to claim 1, wherein the first gate bias terminal, the second gate bias terminal, the first drain bias terminal, and the second drain bias terminal are connected with wiring parts formed on the circuit board via metal embedded on a side surface of the circuit board.

4. The semiconductor amplifier according to claim 1, wherein a ground wiring is formed on the circuit board, the ground wiring connected to the bottom plate on a side surface of the circuit board and an inner wall of the circuit board forming the first opening, and
the ground wiring is connected to the bottom plate between the input terminal or the output terminal and the first gate bias terminal, the second gate bias terminal, the first drain bias terminal, and the second drain bias terminal.

5. The semiconductor amplifier according to claim 1, wherein the circuit board includes notched parts forming the first opening on two sides connecting the one side and the other side.

6. The semiconductor amplifier according to claim 4, wherein two gate wirings interposing one of an input wiring connected to the input terminal and an output wiring connected to the output terminal, the two gate wirings connected to the first gate bias terminal and the second gate bias terminal, and two drain wirings interposing the other of the input wiring connected to the input terminal and the output wiring connected to the output terminal, the two drain wirings connected to the first drain bias terminal and the second drain bias terminal, are formed on the circuit board,
the ground wiring is interposed by the two gate wirings or the two drain wirings in the space, and
two capacitors bypassing the two gate wirings connected to the first gate bias terminal and the second gate bias terminal and two capacitors bypassing the two drain wirings connected to the first drain bias terminal and the second drain bias terminal are mounted on the ground wiring.

7. The semiconductor amplifier according to claim 3, wherein the second matching circuit includes a pair of circuit elements, the pair of circuit elements connected to the drain of the second transistor and arranged symmetrically to a virtual line connecting the input terminal and the output terminal, and the wiring part connected to the second drain bias terminal is connected to the virtual line side of each of the pair of circuit elements via a wire of the same length.

8. The semiconductor amplifier according to claim 7, wherein the drain of the second transistor and the pair of circuit elements are connected via a plurality of wires, and lengths of the plurality of wires are set to increase as the wires are distant from the virtual line.

9. The semiconductor amplifier according to claim 1, wherein the second matching circuit constitutes an LCL circuit between the drain of the second transistor and the output terminal.

10. The semiconductor amplifier according to claim 1, wherein the first matching circuit constitutes an LCL circuit between the drain of the first transistor and the gate of the second transistor.

\* \* \* \* \*